US006617505B2

(12) United States Patent
Shimada

(10) Patent No.: US 6,617,505 B2
(45) Date of Patent: Sep. 9, 2003

(54) SOLAR BATTERY MODULE, REPLACEMENT SOLAR CELL, AND METHOD OF REPLACING SOLAR CELL

(75) Inventor: Keiji Shimada, Kitakatsuragi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/988,226

(22) Filed: Nov. 19, 2001

(65) Prior Publication Data

US 2002/0059952 A1 May 23, 2002

(30) Foreign Application Priority Data

Nov. 21, 2000 (JP) ....................................... 2000-354473
Sep. 12, 2001 (JP) ....................................... 2001-276752

(51) Int. Cl.[7] ....................... H01L 31/042; H01L 31/05; B64G 1/00
(52) U.S. Cl. ....................... 136/244; 136/251; 136/291; 136/290; 136/292; 438/80; 438/15; 438/66; 438/67; 244/173
(58) Field of Search ............................... 136/244, 251, 136/291, 290, 292; 438/80, 15, 66, 67; 244/173

(56) References Cited

U.S. PATENT DOCUMENTS

| 5,006,179 A | * | 4/1991 | Gaddy | 136/244 |
| 5,021,099 A | * | 6/1991 | Kim et al. | 136/249 |
| 5,133,810 A | * | 7/1992 | Morizane et al. | 136/251 |
| 5,567,248 A | * | 10/1996 | Chung | 136/244 |
| 6,433,867 B1 | * | 8/2002 | Esquivel | 356/237.2 |
| 2002/0066828 A1 | * | 6/2002 | Nakamura et al. | 244/173 |

FOREIGN PATENT DOCUMENTS

| JP | 1-181400 | | 5/1989 |
| JP | 2001-77397 A | * | 3/2001 |

* cited by examiner

Primary Examiner—Alan Diamond
(74) Attorney, Agent, or Firm—Nixon & Vanderhye P.C.

(57) ABSTRACT

A solar battery module includes a plurality of solar cells connected to one another and a plurality of spaces each provided between adjacent solar cells, the plurality of spaces including at least one repair space which is larger than other spaces. A replacement solar cell includes an electrode and an interconnector electrically connected to the electrode, the interconnector including a connecting portion, which is positioned with respect to a connecting portion of an interconnector electrically connected to an electrode of an existing solar cell adjacent to the repair space so that the connection by the interconnectors is performed in the repair space. A method of replacing a solar cell includes the steps of simultaneously removing a plurality of existing solar cells arranged between at least two repair spaces, and simultaneously mounting a plurality of replacement solar cells to the region from which the plurality of existing solar cells are removed.

11 Claims, 10 Drawing Sheets

SOLAR BATTERY MODULE, REPLACEMENT SOLAR CELL, AND METHOD OF REPLACING SOLAR CELL

BACKGROUND OF THE INVENTION

1. Field of the Invention

The present invention relates to a solar battery module, a replacement solar cell, and a method of replacing a solar cell.

2. Description of the Background Art

A solar battery module is used, for example, as a power-supply for an artificial satellite, and various shapes thereof have been provided in accordance with the shape of the satellite or the power required. Moreover, the solar battery module has a plurality of solar cells, and a light-receiving side of each solar cell is provided with a cover glass for reducing exposure to radiation and for blocking ultraviolet rays in the universe. The plurality of solar cells are connected in series to form a string, and a plurality of strings are connected in parallel and in series to form the solar battery module. The solar cells are connected to one another via an interconnector. A three-dimensional or two-dimensional stress relief is formed at the interconnector to absorb and alleviate displacement and stress between solar cells.

Incidentally, when a solar cell of the solar battery module is failed or damaged, it must be replaced with a new solar cell.

However, in the conventional solar battery module, as solar cells are arranged close to each other within a string, it has been very difficult to perform such a series of work that only a failed or damaged solar cell is removed and a new solar cell is mounted and connected to existing solar cells adjacent to the failed cell. Thus, even if one solar cell is failed or damaged, the entire string including that cell must be replaced. Therefore, other normal solar cells included in the string are also replaced at the same time, incurring enormous waste.

Moreover, when a failed or damaged solar cell is removed, other normal solar cells adjacent thereto may also be destroyed, causing not only troublesome work but also waste of normal solar cells.

SUMMARY OF THE INVENTION

Therefore, the prevent invention was made in view of the above, and is directed to provide a solar battery module, a replacement solar cell, and a method of replacing a solar cell, that can suppress waste of solar cells to be minimum when a solar cell is replaced.

According to one aspect of the present invention, a solar battery module includes a plurality of solar cells connected to one another, and a plurality of spaces each provided between adjacent ones of the plurality of solar cells. The plurality of spaces includes at least one repair space. The repair space is larger than the other spaces.

According to another aspect of the present invention, in a solar battery module including a plurality of existing solar cells connected to one another and a plurality of spaces each provided between adjacent ones of the plurality of solar cells, the plurality of spaces including at least one repair space, the repair space being larger than other ones of the spaces; a replacement solar cell replacing the existing solar cell includes an electrode and an interconnector electrically connected to the electrode. The interconnector includes a connecting portion. The connecting portion of the interconnector is positioned with respect to a connecting portion of an interconnector electrically connected to an electrode of the existing solar cell adjacent to the repair space, such that connection of the interconnector for the replacement solar cell to the interconnector for the existing solar cell is performed in the repair space.

According to a further aspect of the present invention, in a solar battery module including a plurality of existing solar cells connected to one another, a replacement solar cell includes an electrode of a first conductivity type, an electrode of a second conductivity type opposite to the first conductivity type, a first interconnector electrically connected to the electrode of the first conductivity type, and a second interconnector electrically connected to the electrode of the second conductivity type. The first and second interconnectors include connecting portions respectively. The connecting portion of the first interconnector and the connecting portion of the second interconnector are arranged at one end of the replacement solar cell.

In the replacement solar cell, preferably, the electrode of the first conductivity type is arranged at one end of the replacement solar cell, the electrode of the second conductivity type is arranged at the other end of the replacement solar cell, and the second interconnector extends from the other end to the one end of the replacement solar cell so that the connecting portion of the second interconnector is arranged at the one end of the replacement solar cell.

In the replacement solar cell, preferably, the electrode of the first conductivity type and the electrode of the second conductivity type are arranged at one end of the replacement solar cell.

According to another aspect of the present invention, in a solar battery module including a plurality of existing solar cells connected to one another and a plurality of spaces each provided between adjacent ones of the plurality of solar cells, the plurality of spaces including at least two repair spaces, the repair space being larger than other ones of the spaces; a method of replacing a solar cell includes the steps of simultaneously removing the plurality of existing solar cells arranged between at least two of the repair spaces, and simultaneously mounting a plurality of replacement solar cells into a region from which the plurality of existing solar cells are removed.

In the method of replacing a solar cell, preferably, the step of mounting includes the step of connecting the replacement solar cell to the existing solar cell adjacent to the replacement solar cell, within the repair space.

According to a yet another aspect of the present invention, in a solar battery module including a plurality of existing solar cells connected to one another, a method of replacing a solar cell includes the steps of removing the existing solar cell, and mounting a replacement solar cell smaller than the existing solar cell into a region from which the existing solar cell is removed. A repair space is provided between the replacement solar cell and the existing solar cell adjacent to the replacement solar cell.

In the method of replacing a solar cell, preferably, the replacement solar cell has a power output approximately equal to the existing solar cell.

In the method of replacing a solar cell, preferably, the step of mounting includes the step of connecting the replacement solar cell to the existing solar cell adjacent to the replacement solar cell, within the repair space. Here, the existing solar cell adjacent to the replacement solar cell preferably includes an electrode, and the replacement solar cell includes an electrode and a first interconnector electrically connected to the electrode. The step of mounting preferably includes the steps of connecting the electrode of the existing solar cell adjacent to the replacement solar cell to one connecting portion of a second interconnector and extending the other connecting portion of the second interconnector into the repair space, and connecting a connecting portion of the first interconnector and the other connecting portion of the second interconnector.

Specifically, the solar battery module according to the present invention includes a plurality of solar cells connected to one another, and at least one of spaces between adjacent solar cells is used as a repair space, which is made larger than other spaces.

According to the present invention with such a structure, the repair space between solar cells is made larger. This facilitates connecting work of solar cells performed in the repair space. Moreover, adhesive for fixing the solar cells can easily be processed in the large repair space, so that processing may be started in this repair space and proceeded to the periphery of a solar cell, to allow detachment of the solar cell.

Moreover, the replacement solar cell according to the present invention is to replace a solar cell of the solar battery module described above, and a connecting portion of an interconnector electrically connected to an electrode of the replacement solar cell and a connecting portion of an interconnector electrically connected to an electrode of an existing solar cell adjacent to the replacement solar cell are positioned such that connection of the interconnector for the replacement solar cell to the interconnector for the existing solar cell is performed in the repair space.

Here, the position of the connecting portion of the interconnector electrically connected to the electrode of the replacement solar cell is set in accordance with the position of the repair space, such that connection by the interconnector is performed in the repair space.

Moreover, the replacement solar cell according to the present invention is for a solar battery module including a plurality of solar cells connected to one another, and includes interconnectors used for connection to an existing solar cell adjacent to the replacement solar cell. A connecting portion of an interconnector electrically connected to an N-electrode of the replacement solar cell and a connecting portion of an interconnector electrically connected to a P-electrode of the replacement solar cell are both arranged on one side of the replacement solar cell.

Here, the replacement solar cell may be mounted with a side thereof adapted to the repair space, to allow connection by each interconnector to be performed in the repair space.

Furthermore, in the replacement solar cell according to the present invention, one of the connecting portions of the interconnector electrically connected to the N-electrode and of the interconnector electrically connected to the P-electrode extends to one side of the replacement solar cell on which the other one of the connecting portions is arranged.

By thus extending one of the connecting portions of the interconnectors to one side of the replacement solar cell on which the other one of the connecting portions is arranged, the connecting portions of both interconnectors can be arranged together on one side of the replacement solar cell, even if the electrodes are spaced apart.

The replacement method according to the present invention is to replace a solar cell of the solar battery module, in which a plurality of solar cells arranged between repair spaces are simultaneously replaced.

If, for example, three solar cells are arranged between two repair spaces, all of the three solar cells are simultaneously replaced. As described earlier, connection of solar cells to each other and processing of an adhesion may easily be performed in the repair space. Therefore, replacement of solar cells between the repair spaces may be facilitated.

Furthermore, in the replacement method according to the present invention, the replacement solar cell used for replacement and an existing solar cell adjacent to the replacement solar cell are connected in the repair space.

Accordingly, connecting work may easily be performed in the repair space.

In addition, the replacement method according to the present invention is for replacing a solar cell of a solar battery module including a plurality of solar cells connected to one another, in which an existing solar cell is replaced with a smaller replacement solar cell so that a repair space is formed.

When such a small replacement solar cell is mounted, a large repair space is formed adjacent to the replacement solar cell. Thus, connection of the replacement solar cell to the existing solar cell can easily be performed in the large repair space.

Moreover, in the replacement method according to the present invention, the smaller solar cell has a power output approximately equal to the existing solar cell.

This prevents lowering of the power output of the solar battery module even after the smaller replacement solar cell is mounted.

Moreover, in the replacement method according to the present invention, the replacement solar cell after replacement and the existing solar cell adjacent to the replacement solar cell are connected in the repair space.

The connection work is facilitated because of the large size of the repair space.

Furthermore, in the replacement method of the present invention, an electrode of an existing solar cell adjacent to the replacement solar cell is connected to an interconnector, and a connecting portion of the interconnector is arranged to extend to the repair space and is connected to a connecting portion of an interconnector electrically connected to an electrode of the replacement solar cell.

Here, the electrode of the existing solar cell is connected to the interconnector and the connecting portion of this interconnector extends to the repair space to be connected to the connecting portion of the interconnector for the replacement solar cell. Thus, the interconnector for the existing solar cell can be connected to the interconnector for the replacement solar cell, even if the electrode of the existing solar cell is spaced from the repair space.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described below in detail with reference to the drawings.

Figure 1:
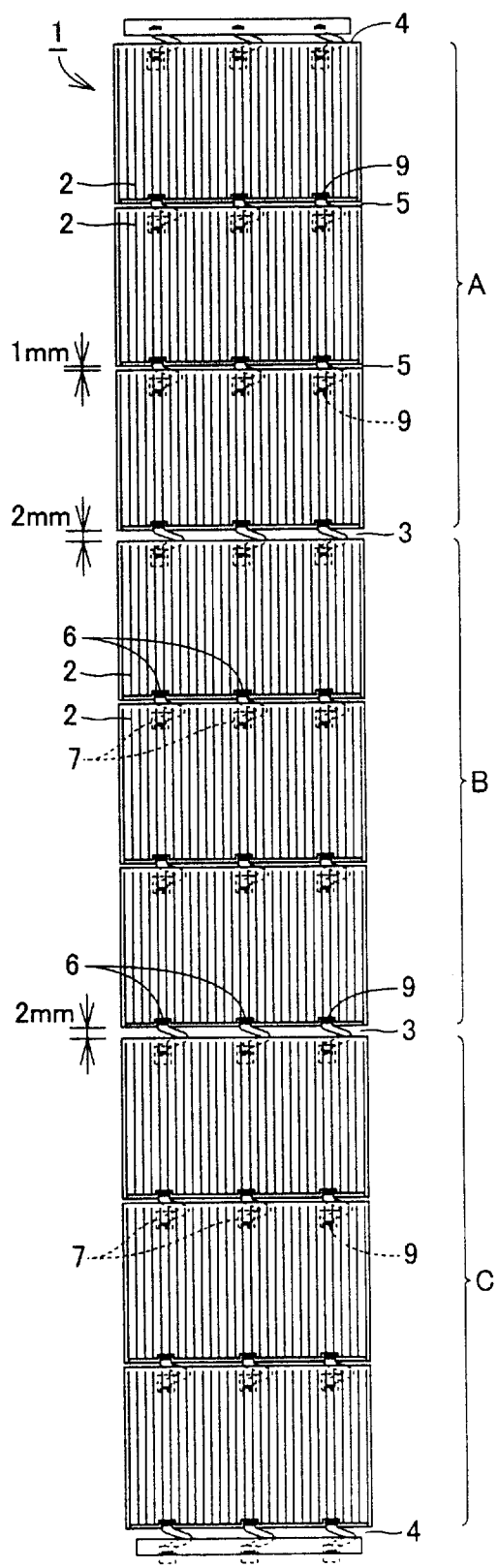
FIG. 1 is a plan view showing a string according to the first embodiment of a solar battery module of the present invention.

FIG. 1 shows a string according to the first embodiment of a solar battery module of the present invention. The solar battery module according to the present embodiment finds application in, for example, a power-supply of an artificial satellite.

As shown in FIG. 1, a string 1 of the solar battery module is formed by nine solar cells 2 that are connected in series and adhered on an insulated substrate (not shown). Solar cells 2 in string 1 are divided into three groups A, B and C, and repair spaces 3 are provided between groups A and B, and between groups B and C, respectively. Moreover, separation spaces 4 separating one string from another are provided at the upper side of group A and at the lower side of group C, respectively.

Each solar cell 2 has a dimension of 40 mm×60 mm in vertical and horizontal lengths respectively. Each repair space 3 and each separation space 4 have a width of 2 mm, whereas a regular space 5 has a width of 1 mm. Therefore, the total length of string 1 is 378 mm.

In addition, each solar cell 2 has N-electrode pads 6 at the lower edge thereof and P-electrode pads 7 at the upper edge thereof. N-electrode pads 6 in one of two adjacent solar cells 2 are electrically connected to P-electrode pads 7 in the other one of the adjacent solar cells 2 via interconnectors 9, respectively.

Now, in string 1 having such a structure, when any one of solar cells 2 in e.g. group B is failed, three solar cells 2 in group B are removed and three new replacement solar cells are mounted by the procedure as described below.

Figure 2:
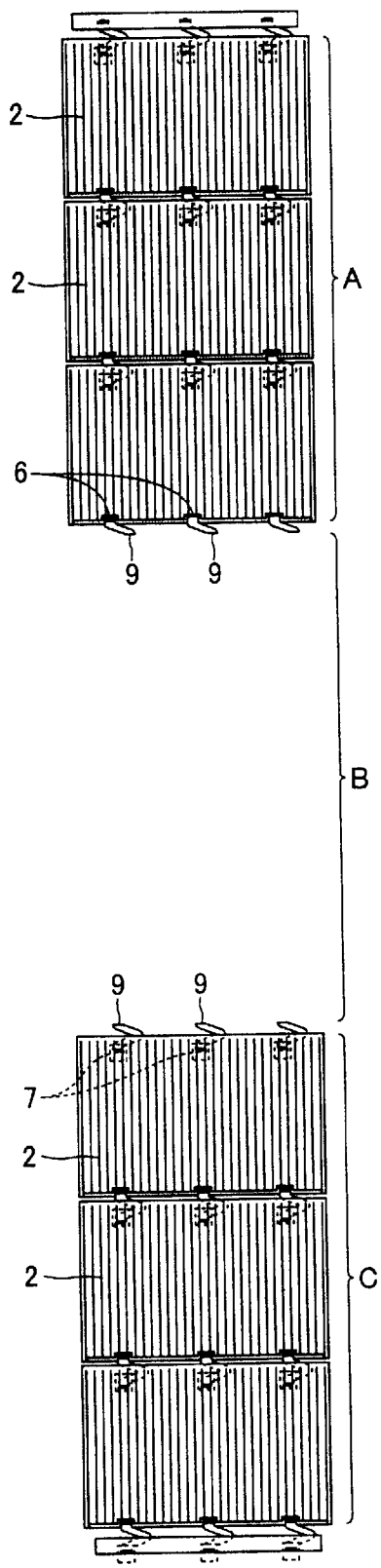
FIG. 2 is a plan view showing the string in FIG. 1 from which three solar cells have been removed.

First, interconnectors 9 in repair space 3 between groups A and B are cut, while interconnectors 9 in repair space 3 between groups B and C are also cut. Then, for example, piano wire or the like having a diameter of approximately 0.1 mm is introduced into repair space 3, and is moved between solar cells 2 in group B and the insulated substrate, to cut adhesive between solar cells 2 and the insulated substrate so that solar cells 2 are removed. As a result, string 1 comes to a state as shown in FIG. 2. In addition, a cutter or the like is used in the space of group B to remove remaining adhesive on the insulated substrate.

Figure 3:
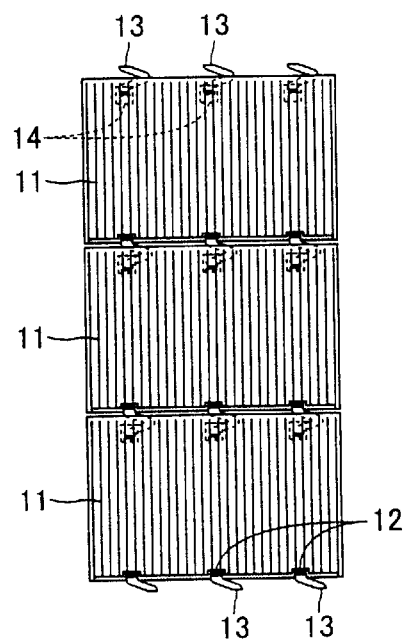
FIG. 3 is a plan view showing three replacement solar cells.
Figure 4:
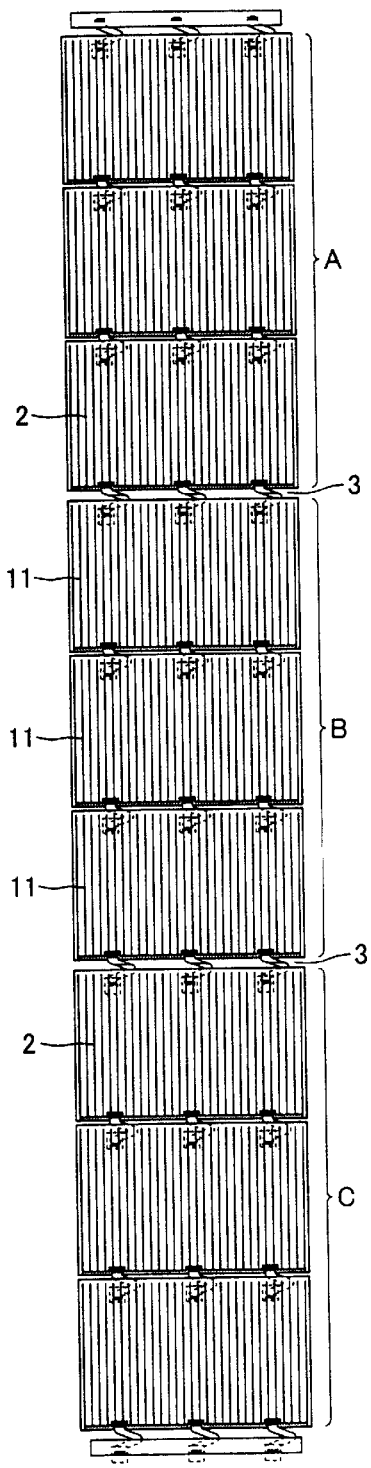
FIG. 4 is a plan view showing the string in FIG. 2 to which the replacement solar cells shown in FIG. 3 are mounted.

Subsequently, a set of three replacement solar cells 11 as shown in FIG. 3 is adhered to the space of group B shown in FIG. 2 by an adhesive. As the adhesive, for example, RTV-S691 (trade name) from Wacker-Chemie GmbH is applied. Then, as shown in FIGS. 2 to 4, in repair space 3 between groups B and C, interconnectors 13 electrically connected to respective N-electrode pads 12 of replacement solar cell 11 at the lower side are connected to interconnectors 9 electrically connected to P-electrode pads 7 of existing solar cell 2 adjacent to replacement solar cell 11, respectively, by soldering or the like. Likewise, in repair space 3 between groups A and B, interconnectors 13 electrically connected to respective P-electrode pads 14 of replacement solar cell 11 at an upper side are connected to interconnectors 9 electrically connected to respective N-electrode pads 6 of existing solar cell 2 adjacent to replacement solar cell 11, respectively, by soldering or the like.

As such, replacement of three solar cells 2 by three replacement solar cells 11 is completed.

Thus, according to the present embodiment, if any one of solar cells 2 in string 1 is failed, replacement thereof is performed per group including three solar cells 2, eliminating the need for replacing the other two groups including six normal solar cells 2. This greatly cuts down on waste compared to the conventional example in which the entire string was replaced.

Moreover, because the large repair space 3 is provided per group of three solar cells, piano wire can easily be introduced into repair space 3 to cut adhesive to remove solar cells 2, and also replacement solar cells 11 and existing solar cells 2 can easily be connected in this repair space 3.

It is noted that the width of each repair space 3 and the number of repair spaces 3 in string 1 may appropriately be increased or reduced. As the width and number of spare spaces 3 increases, the number of solar cells to be replaced when failed is reduced, facilitating removal of solar cells or work of connecting. However, this reduces the area occupied by each solar cell, lowering power generation efficiency of the solar battery module. Therefore, the width or number of repair spaces 3 is increased when the solar battery module has an output sufficient for the power required by an artificial satellite, whereas the number of repair spaces is reduced when the output of the solar battery module is insufficient, to increase the output of the solar battery module. Even with only one repair space 3 provided in string 1, solar cells 2 in string 1 are divided into two groups, so that the number of solar cells to be replaced at failure is reduced to half compared to the conventional example in which the entire string was replaced, greatly cutting down on waste.

Figure 5:
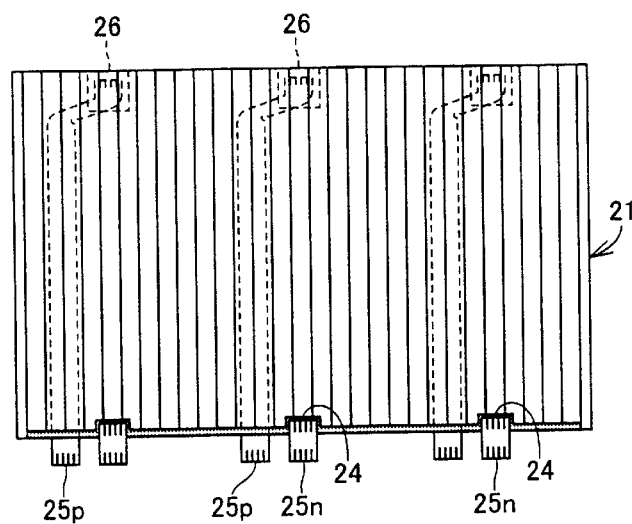
FIG. 5 is a plan view showing a replacement solar cell according to the second embodiment of the solar battery module of the present invention.

FIG. 5 shows a replacement solar cell according to the second embodiment of the solar battery module of the present invention.

Figure 6:
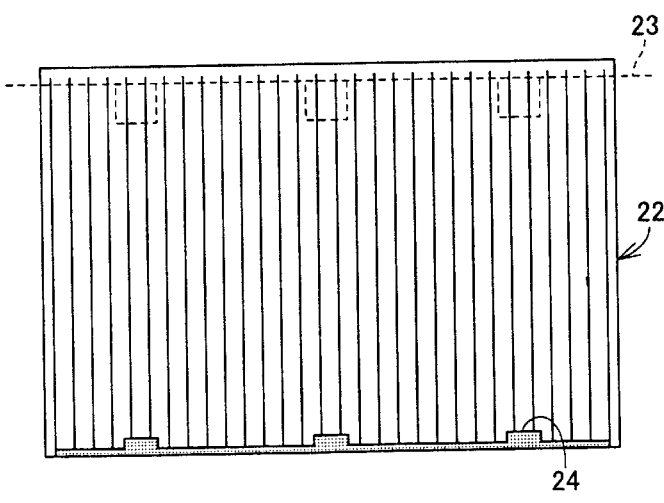
FIG. 6 is a plan view showing an ordinary solar cell.

A replacement solar cell 21 according to the present embodiment is formed as follows: an ordinary solar cell 22 shown in FIG. 6 is cut (diced) along a dotted line 23, interconnectors 25n are connected to N-electrode pads 24 respectively while interconnectors 25p are connected to P-electrode pads 26 respectively, and connecting portions of respective interconnectors 25p are arranged to extend to the side on which connecting portions of respective interconnectors 25n are arranged.

Replacement solar cell 21 is formed by cutting ordinary solar cell 22 shown in FIG. 6, so that its vertical length is shorter than that of ordinary solar cell 22. Thus, when replacement solar cell 21 is used for replacement instead of ordinary solar cell 22, a wide space for repairing is formed adjacent to replacement solar cell 21.

Figure 7:
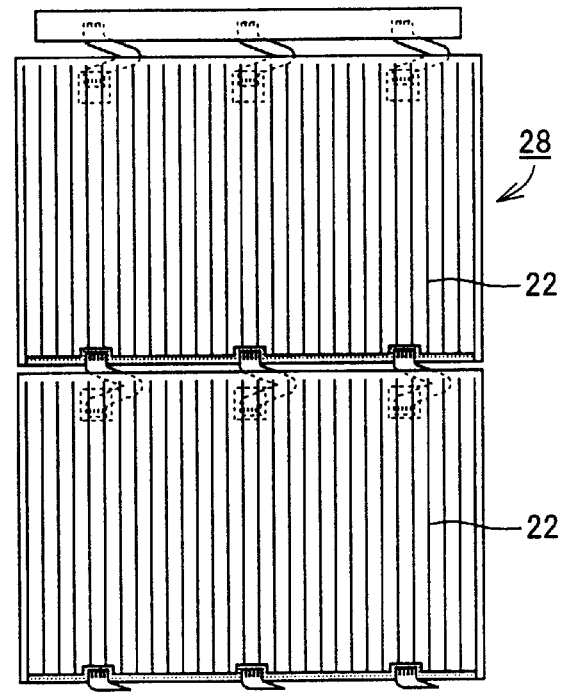
FIG. 7 is a plan view showing a string from which one failed solar cell has been removed.
Figure 7:
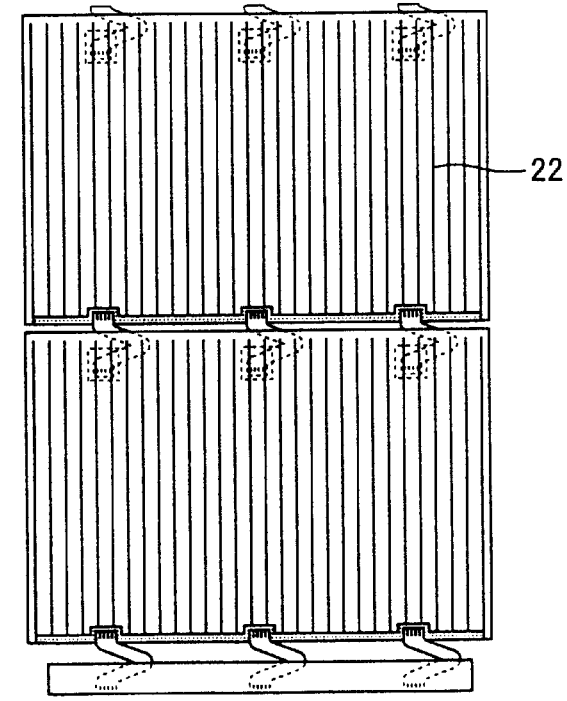

FIG. 7 shows a string 28 of the solar battery module according to the present embodiment, from which one failed solar cell has already been removed. The procedure of mounting replacement solar cell 21 to string 28 will be described below.

Figure 8:
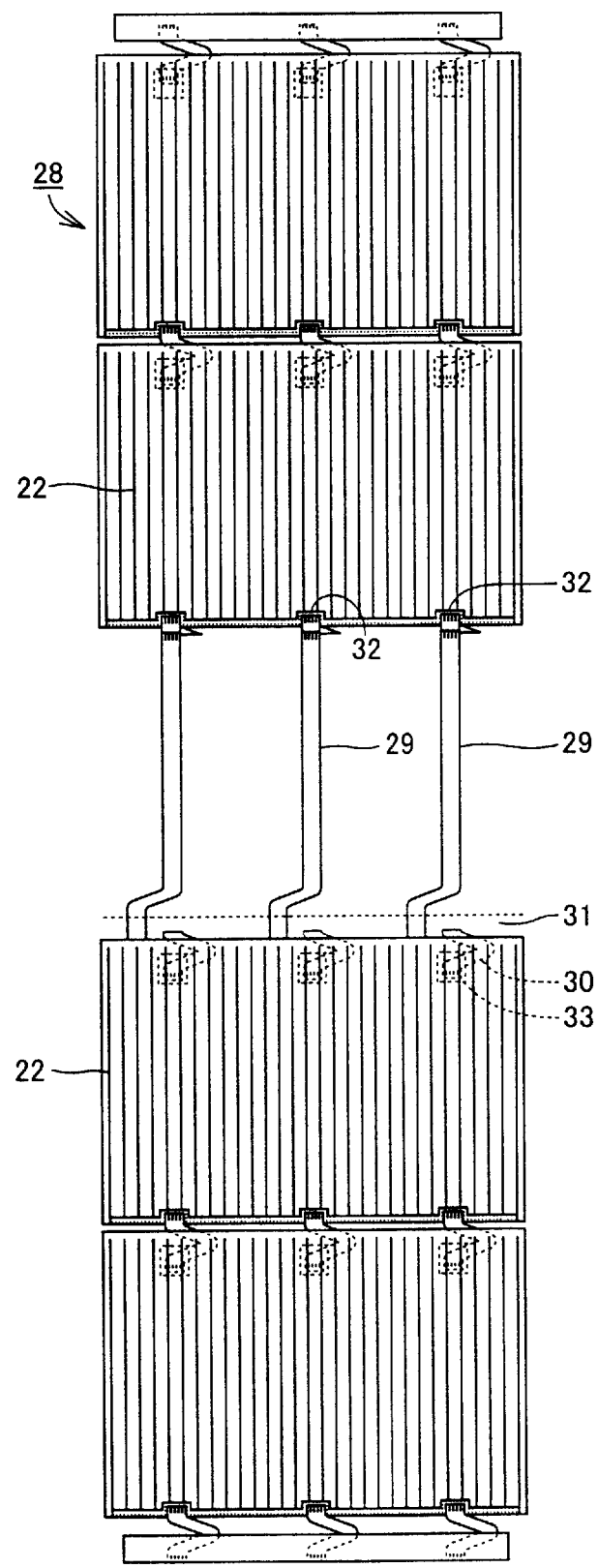
FIG. 8 is a plan view showing the string in FIG. 7 to which extension lines are connected.

First, as shown in FIG. 8, N-electrode pads 32 of existing solar cell 22 adjacent to replacement solar cell 21 are connected to respective repair interconnectors 29, and connecting portions of the respective repair interconnectors 29 are arranged to extend to a section which is to be a repair space 31.

Figure 9:
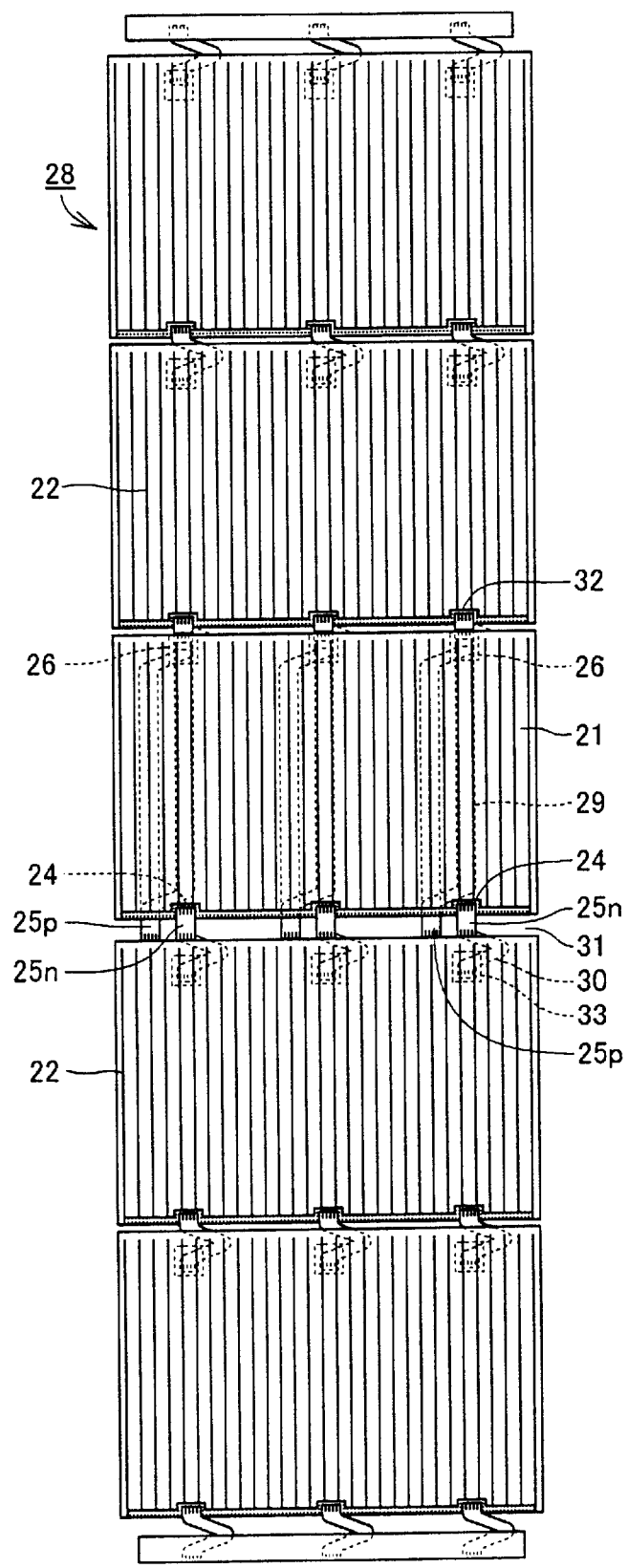
FIG. 9 is a plan view showing the string in FIG. 8 to which the replacement solar cell in FIG. 5 is mounted.

Subsequently, as shown in FIG. 9, replacement solar cell 21 is placed and adhered. Here, repair space 31 is provided at a lower side of replacement solar cell 21. Then, in repair space 31, interconnectors 25n electrically connected to respective N-electrode pads 24 of replacement solar cell 21 are connected to interconnectors 30 electrically connected to respective P-electrode pads 33 of the adjacent solar cell 22 on the lower side, respectively, by soldering or the like. In addition, interconnectors 25p electrically connected to respective P-electrode pads 26 of replacement solar cell 21 are connected to repair interconnectors 29 electrically connected to respective N-electrode pads 32 of the adjacent solar cell 22 on the upper side, respectively, by soldering or the like. As a result, replacement solar cell 21 is serially connected to existing solar cells 22.

As such, according to the present embodiment, a failed ordinary solar cell 22 is replaced with replacement solar cell 21 having a shorter vertical length, so that wide repair space 31 is formed in which replacement solar cell 21 is connected to existing solar cells 22, facilitating the connection work.

Moreover, the connecting portions of interconnectors 25p, 29 are arranged to extend to repair space 31 such that P-electrode pads 26 of replacement solar cell 21 can be connected to N-electrode pads 32 of the adjacent solar cell 22 on the upper side, respectively, in repair space 31, so that only one repair space is required. This can prevent enlargement of the repair space and thus prevent reduction of the area occupied by each solar cell and lowering of power generation efficiency of the solar battery module.

Furthermore, replacement solar cell 21 can easily be fabricated, since it is formed by cutting ordinary solar cell 22.

Figure 10:
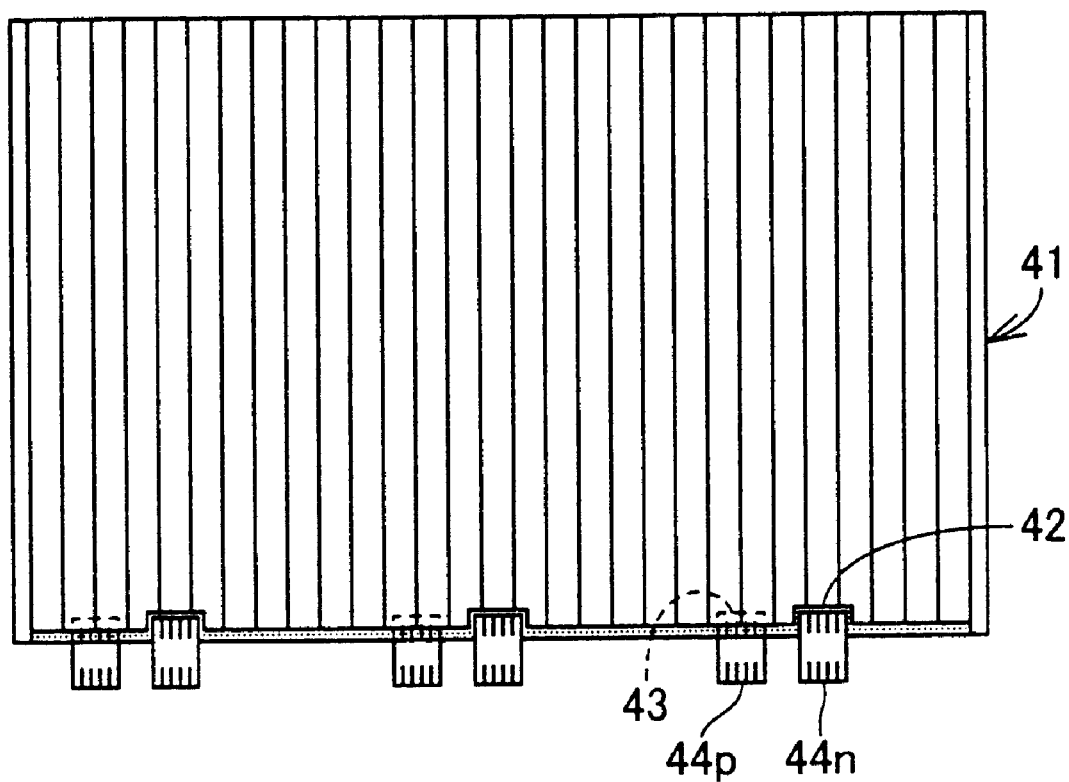
FIG. 10 is a plan view showing a replacement solar cell according to the third embodiment of the solar battery module of the present invention.

FIG. 10 shows a replacement solar cell according to the third embodiment of the solar battery module of the present invention.

Replacement solar cell 41 according to the present embodiment includes N-electrode pads 42 and P-electrode pads 43 provided together at a lower side thereof, in which N-electrode pads 42 are connected to respective interconnectors 44n while P-electrode pads 43 are connected to respective interconnectors 44p.

Figure 11:
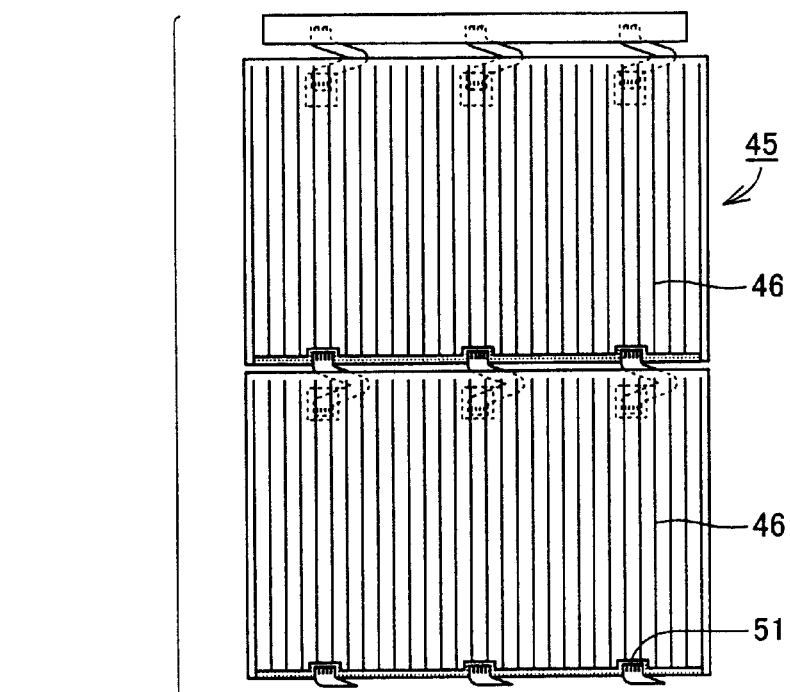
FIG. 11 is a plan view showing a string from which one failed solar cell has been removed.
Figure 11:
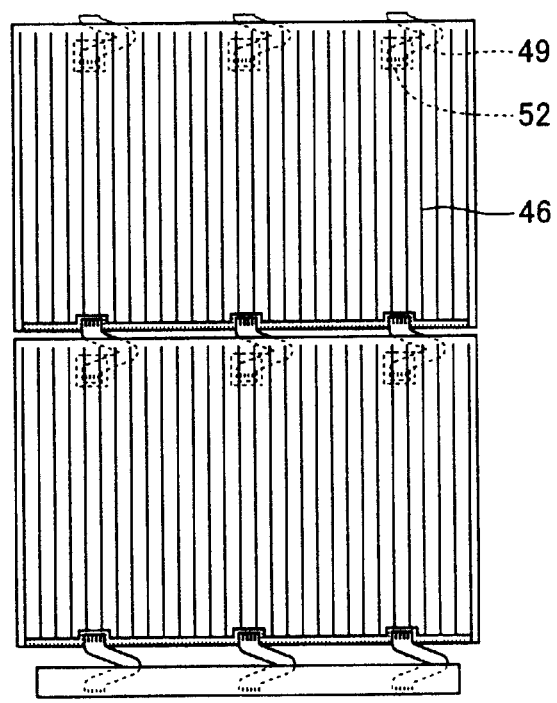

Replacement solar cell 41 also has a vertical length shorter than that of an ordinary solar cell 46 in a string 45 shown in FIG. 11. Thus, when replacement solar cell 41 is used for replacement instead of ordinary solar cell 46, a repair space is formed adjacent to replacement solar cell 41.

Figure 12:
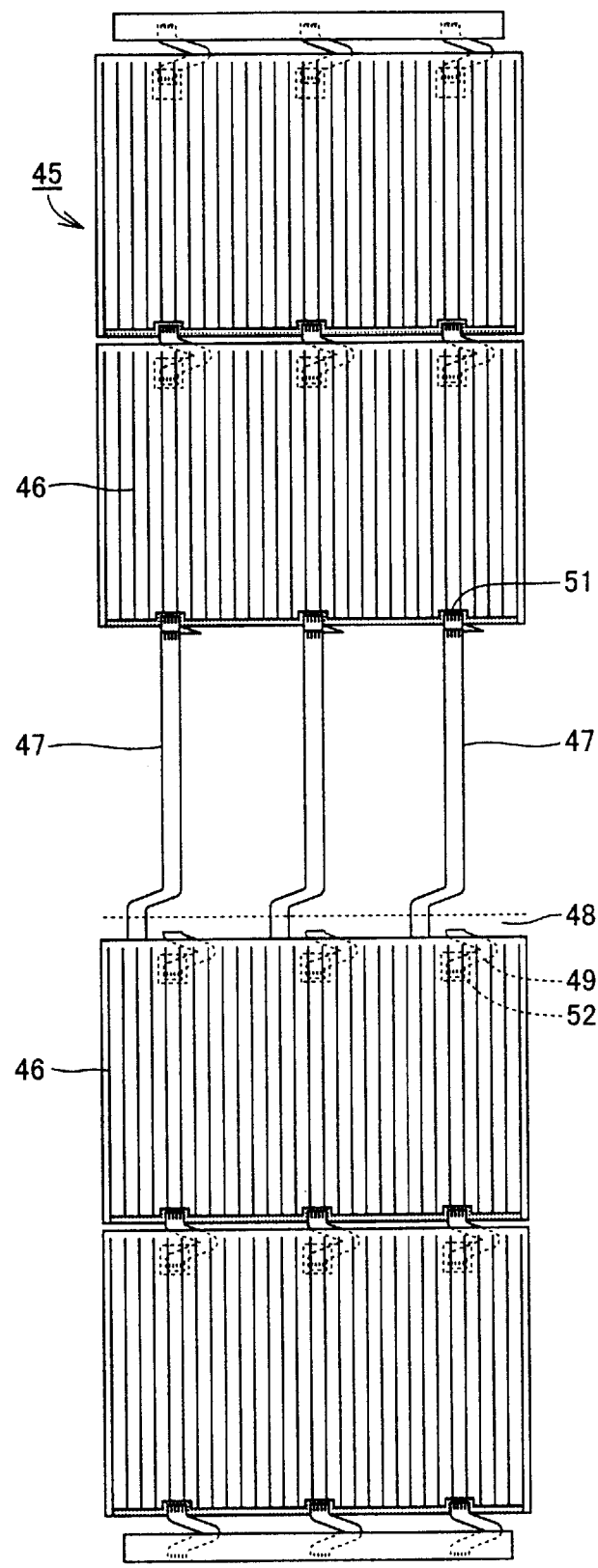
FIG. 12 is a plan view showing the string in FIG. 11 to which extension lines are connected.

In order to mount replacement solar cell 41 to string 45 from which one failed solar cell 46 has already been removed as shown in FIG. 11, first, as shown in FIG. 12, N-electrode pads 51 of existing solar cell 46 adjacent to replacement solar cell 41 are connected to respective repair interconnectors 47, and connecting portions of these interconnectors 47 are arranged to extend to a section which is to be a repair space 48.

Figure 13:
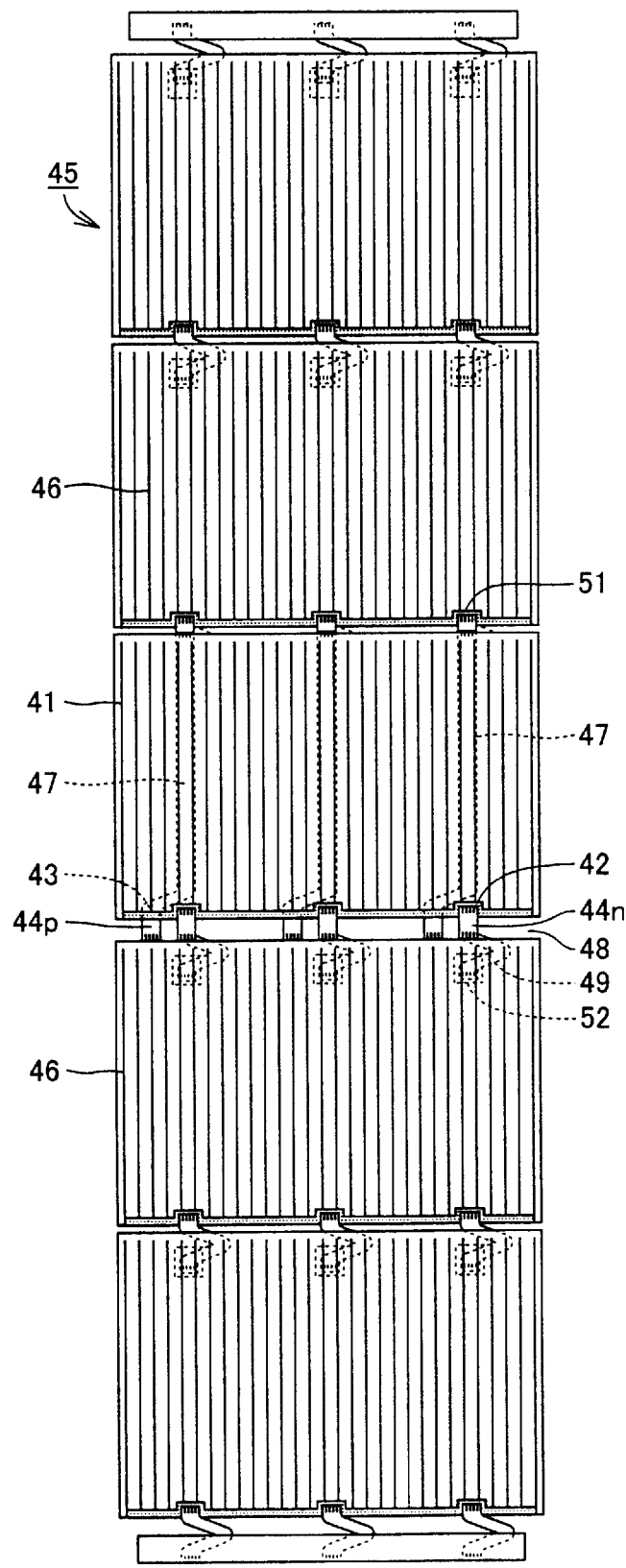
FIG. 13 is a plan view showing the string in FIG. 12 to which the solar cell in FIG. 10 is mounted.

Subsequently, as shown in FIG. 13, replacement solar cell 41 is placed and adhered, and repair space 48 is provided at a lower side of replacement solar cell 41. Thereafter, in repair space 48, interconnectors 44n electrically connected to respective N-electrode pads 42 of replacement solar cell 41 are connected to interconnectors 49 electrically connected to respective electrode pads 52 of the adjacent solar cell 46 on the lower side, respectively, by soldering or the like. In addition, interconnectors 44p electrically connected to respective electrode pads 43 of replacement solar cell 41 are connected to repair interconnectors 47 electrically connected to respective N-electrode pads 51 of the adjacent solar cell 46 on the upper side, respectively, by soldering or the like. As a result, replacement solar cell 41 is serially connected to existing solar cells 46.

In the present embodiment also, a failed ordinary solar cell 46 is replaced with replacement solar cell 41 having a shorter vertical length, so that wide repair space 48 is formed, facilitating connection work between replacement solar cell 42 and existing solar cells 46. Moreover, only one repair space is provided, so that enlargement of the repair space is suppressed, preventing reduction of the area occupied by each solar cell and lowering of power generation efficiency of the solar battery module.

Furthermore, replacement solar cell 41 includes N-electrode pads 42 and P-electrode pads 43 provided together on one side thereof, so that the length of repair interconnectors for one of N-electrode pads 42 or P-electrode pads 43 can be shortened.

In the second and third embodiments, the vertical length of a replacement solar cell is shorter than that of an existing solar cell, resulting in a small light-receiving area. Thus, the replacement solar cell preferably has a high power generation efficiency per unit area and a total output approximately equal to that of the existing solar cell. For example, assuming that the dimension of the existing solar cell is 40 mm×60 mm in vertical and horizontal lengths and that of the replacement solar cell is 39 mm×60 mm, the light-receiving area for the replacement solar cell is reduced by 2.5%. In such a case, the replacement solar cell preferably has a power generation efficiency per unit area that is approximately 2.5% higher.

It is noted that the present invention is not limited to the embodiments described above, and may be modified in various manners; For example, the present invention may apply to any type or size of a solar cell. Moreover, either side of one solar cell may be provided with a repair space.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A solar battery module, comprising:
    a plurality of solar cells connected to one another; and
    a plurality of spaces, each provided between adjacent ones of said plurality of solar cells,
    said plurality of spaces including at least one repair space,
    said repair space being larger than other ones of said spaces.

2. In a solar battery module including a plurality of existing solar cells connected to one another and a plurality of spaces each provided between adjacent ones of said plurality of solar cells, said plurality of spaces including at least one repair space, said repair space being larger than other ones of said spaces; a replacement solar cell replacing an existing solar cell, comprising:

an electrode; and an interconnector electrically connected to said electrode, said interconnector including a connecting portion, said connecting portion of said interconnector being positioned with respect to a connecting portion of an interconnector electrically connected to an electrode of an existing solar cell adjacent to said repair space, such that connection of said interconnector for said replacement solar cell to said interconnector for said adjacent existing solar cell is performed in said repair space.

3. A replacement solar cell in a solar battery module including a plurality of existing solar cells connected to one another, comprising:

an electrode of a first conductivity type;

an electrode of a second conductivity type opposite to said first conductivity type;

a first interconnector electrically connected to said electrode of the first conductivity type;

a second interconnector electrically connected to said electrode of the second conductivity type, said first and second interconnectors including connecting portions respectively, the connecting portion of said first interconnector and the connecting portion of said second interconnector being arranged at one end of the replacement solar cell, and wherein all connecting portions of the first and second interconnectors are located at said one end of the replacement solar cell, so that no connecting portions of any interconnector(s) is/are located at another end of the replacement solar cell opposite said one end.

4. The replacement solar cell according to claim 3, wherein said electrode of the first conductivity type is arranged at one end of the replacement solar cell, said electrode of the second conductivity type is arranged at the other end of the replacement solar cell, and said second interconnector extends from said other end to said one end of the replacement solar cell so that the connecting portion of said second interconnector is arranged at said one end of the replacement solar cell.

5. The replacement solar cell according to claim 3, wherein said electrode of the first conductivity type and said electrode of the second conductivity type are arranged at one end of the replacement solar cell.

6. A method of replacing a solar cell in a solar battery module including a plurality of existing solar cells connected to one another and a plurality of spaces each provided between adjacent ones of said plurality of solar cells, said plurality of spaces including at least two repair spaces, said repair spaces being larger than other ones of said spaces, the method comprising:

removing, simultaneously, a plurality of existing solar cells arranged between at least two of said repair spaces; and mounting, simultaneously, a plurality of replacement solar cells into a region from which said plurality of existing solar cells are removed.

7. The method of replacing a solar cell according to claim 6, wherein said step of mounting includes the step of connecting a replacement solar cell to an existing solar cell adjacent to said replacement solar cell, within said repair space.

8. A method of replacing a solar cell in a solar battery module including a plurality of existing solar cells connected to one another, the method comprising:

removing an existing solar cell; and mounting a replacement solar cell smaller than said existing solar cell into a region from which said existing solar cell is removed, a repair space being provided between said replacement solar cell and said existing solar cell adjacent to said replacement solar cell.

9. The method of replacing a solar cell according to claim 8, wherein said replacement solar cell has a power output approximately equal to said existing solar cell.

10. The method of replacing a solar cell according to claim 8, wherein said step of mounting includes the step of connecting said replacement solar cell to an existing solar cell adjacent to said replacement solar cell, within said repair space.

11. The method of replacing a solar cell according to claim 10, wherein said existing solar cell adjacent to said replacement solar cell includes an electrode, said replacement solar cell includes an electrode and a first interconnector electrically connected to said electrode of said replacement solar cell, said step of mounting includes the steps of connecting said electrode of said existing solar cell adjacent to said replacement solar cell to one connecting portion of a second interconnector and extending another connecting portion of said second interconnector into said repair space, and connecting a connecting portion of said first interconnector and said another connecting portion of said second interconnector.

* * * * *